United States Patent
Shomura et al.

(10) Patent No.: US 8,609,997 B2
(45) Date of Patent: Dec. 17, 2013

(54) MULTILAYER WIRING SUBSTRATE

(75) Inventors: Tomohiro Shomura, Nagano (JP); Shinichi Imasaka, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 237 days.

(21) Appl. No.: 12/647,859

(22) Filed: Dec. 28, 2009

(65) Prior Publication Data
US 2011/0000706 A1 Jan. 6, 2011

(30) Foreign Application Priority Data
Jul. 6, 2009 (JP) .................................. 2009-160134

(51) Int. Cl.
*H05K 1/11* (2006.01)

(52) U.S. Cl.
USPC ........................... 174/262; 174/260; 174/264

(58) Field of Classification Search
USPC ......................................... 361/760, 792–795
See application file for complete search history.

(56) References Cited

U.S. PATENT DOCUMENTS

| | | | |
|---|---|---|---|
| 5,200,579 A * | 4/1993 | Takeuchi ....................... | 174/256 |
| 5,570,504 A * | 11/1996 | DiStefano et al. ............... | 29/830 |
| 6,828,510 B1 * | 12/2004 | Asai et al. ..................... | 174/255 |
| 7,696,613 B2 | 4/2010 | Nakamura et al. | |
| 8,240,036 B2 * | 8/2012 | Yoshioka et al. ............... | 29/846 |
| 2002/0046880 A1 * | 4/2002 | Takubo et al. ................. | 174/261 |
| 2004/0136152 A1 | 7/2004 | Mitsuhashi et al. | |
| 2005/0039948 A1 | 2/2005 | Asai et al. | |
| 2007/0057375 A1 | 3/2007 | Nakamura | |
| 2008/0012140 A1 | 1/2008 | Tsukano et al. | |
| 2008/0277148 A1 | 11/2008 | Asai et al. | |
| 2009/0139751 A1 * | 6/2009 | Sunohara ....................... | 174/255 |
| 2009/0242262 A1 * | 10/2009 | Asano ........................... | 174/267 |

FOREIGN PATENT DOCUMENTS

| | | |
|---|---|---|
| JP | 2000-323613 | 11/2000 |
| JP | 2000-349435 | 12/2000 |
| JP | 2002-076530 | 3/2002 |
| JP | 2003-031952 | 1/2003 |
| JP | 2003-046249 | 2/2003 |
| JP | 2004-047545 | 2/2004 |
| JP | 2004-095854 | 3/2004 |
| JP | 2004-356219 | 12/2004 |
| JP | 2005-236067 | 9/2005 |
| JP | 2007-73766 | 3/2007 |
| JP | 2007-081157 | 3/2007 |
| JP | 2008-21921 | 1/2008 |

* cited by examiner

*Primary Examiner* — Ishwarbhai Patel
(74) *Attorney, Agent, or Firm* — Rankin, Hill & Clark LLP

(57) ABSTRACT

A multilayer wiring substrate includes a center wiring layer arranged in a center of the substrate in a thickness direction, and wiring layers stacked on one side of the center wiring layer and the other side of the center wiring layer via an insulating layer. The wiring layers on one side of the center wiring layer and the wiring layers on the other side are provided in a same layer number. The insulating layers on one side of the center wiring layer and the insulating layers on the other side are provided in a same layer number.

10 Claims, 7 Drawing Sheets

MULTILAYER WIRING SUBSTRATE

This application claims priority to Japanese Patent Application No. 2009-160134, filed Jul. 6, 2009, in the Japanese Patent Office. The Japanese Patent Application No. 2009-160134 is incorporated by reference in its entirety.

TECHNICAL FIELD

The present disclosure relates to a multilayer wiring substrate to which a warp preventing structure is provided.

RELATED ART

As a wiring substrate on which a semiconductor element is mounted, the multilayer wiring substrate in which a wiring layer is formed on both surfaces of a core substrate is widely employed. With a reduction in thickness of the multilayer wiring substrate and an increase in density of wiring patterns, the multilayer wiring substrate not equipped with a core substrate is provided nowadays. This multilayer wiring substrate without the core substrate possesses such advantages that a reduction in thickness is easy and wiring patterns can be formed with high density.

However, the multilayer wiring substrate without the core substrate is inferior in strength of the substrate itself to the multilayer wiring substrate with the core substrate, and is ready to warp. For this reason, various methods of suppressing a warp of the substrate, i.e., the method of forming the insulating layer by employing the insulating material, in which a reinforcement such as a glass cloth, or the like is mixed into a resin material such as an epoxy resin, or the like, to enhance strength of the substrate, the method of arranging symmetrically respective patterns of the wiring layers (including the vias), between which a core layer is put, and the like have been proposed (see Patent Literature 4).

PRIOR TECHNICAL LITERATURE

Patent Literature

[Patent Literature 1] JP-A-2000-323613
[Patent Literature 2] JP-A-2004-356219
[Patent Literature 3] JP-A-2005-236067
[Patent Literature 4] JP-A-2007-81157

In the actual multilayer wiring substrate, arrangements of the conductor portions such as the wiring patterns, the vias, etc. are formed variously in respective wiring layers. In this manner, arrangements of the conductor portions in respective layers are uneven, and as a result a warping direction (upward convex, downward convex, or the like) of the substrate and an amount of warp are delicately different. In particular, in the multilayer wiring substrate without the core substrate, such a problem readily arises that, since strength of the substrate itself is insufficient, a warp of the substrate is caused due to a difference of balance such as a degree of shrinkage of the insulating layer, and the like.

SUMMARY

Exemplary embodiments of the present invention provide a multilayer wiring substrate to which no core substrate is provided.

A multilayer wiring substrate according to an exemplary embodiment of the invention, comprises:

a center wiring layer arranged in a center of the substrate in a thickness direction; and one or more wiring layers stacked on one side of the center wiring layer via one or more insulating layers and one or more wiring layers stacked on the other side of the center wiring layer via one or more insulating layers;

wherein the one or more wiring layers on one side of the center wiring layer and the one or more wiring layers on the other side are provided in a same layer number, and the one or more insulating layers on one side of the center wiring layer and the one or more insulating layers on the other side are provided in a same layer number.

The insulating layers located in symmetrical positions with respect to the center wiring layer on one side and the other side of the center wiring layer respectively may have equal thickness. Therefore, the stresses caused due to the insulating layers are made equal on one side and the other side of the center wiring layer, and a warp of the substrate is suppressed. In this case, the insulating layers on one side and the other side of the substrate contain conceptually the case of single layer and the case of plural layers respectively.

The insulating layers located in symmetrical positions with respect to the center wiring layer may be formed of a resin material into which reinforcement is mixed. Therefore, the stresses caused due to the insulating layers formed on one side and the other side of the center wiring layer are made equal, the substrate is reinforced, and a warp of the substrate is suppressed further more.

The insulating layers located adjacent to the center wiring layer on one side and the other side of the center wiring layer respectively may be formed of a resin material into which reinforcement is mixed, and the insulating layers located in outer layers than the insulating layers located adjacent to the center wiring layer may be formed of a resin material into which no reinforcement is mixed. Therefore, a warp of the substrate is suppressed effectively, and the wiring patterns formed in the multilayer wiring substrate can be formed with high precision and at a high density.

The insulating layers located in symmetrical positions with respect to the center wiring layer may be formed on one side and the other side of the center wiring layer such that stresses caused by the insulating layers formed on one side and the other side of the center wiring layer are made uneven, and the substrate may be planarized in which stresses caused by an uneven distribution of conductors in the wiring layers formed on one side and the other side of the center wiring layer are cancelled by the insulating layers. When the conductors of the wiring layers are distributed unevenly on one side and the other side of the center wiring layer, the insulating layers located in symmetrical positions with respect to the center wiring layer are formed such that the stresses caused due to the insulating layers are made uneven on one side and the other side of the center wiring layer. Therefore, a warp of the substrate can be suppressed, and the substrate can be made flat.

The insulating layers located in symmetrical positions with respect to the center wiring layer may be formed to have an unequal thickness on one side and the other side of the center wiring layer respectively. Therefore, the stresses caused due to the insulating layers formed on one side and the other side of the center wiring layer can be made uneven.

The insulating layers located in symmetrical positions with respect to the center wiring layer may be formed of a different type of insulating material on one side and the other side of the center wiring layer respectively. Therefore, the stresses caused due to the insulating layers formed on one side and the other side of the center wiring layer can be made uneven.

The insulating layers located on one side of the center wiring layer can be formed of a resin material into which reinforcement is mixed, and the insulating layers located on the other side of the center wiring layer may be formed of a resin material into which no reinforcement is mixed. Therefore, the stresses caused due to the insulating layers formed on one side and the other side of the center wiring layer can be made uneven.

The multilayer wiring substrate may further comprise: a plurality of vias, via which the wiring layers including the center wiring layer are connected electrically, wherein the via located on one side of the center wiring layer and the via located on the other side are formed in a symmetrical fashion with respect to the center wiring layer to have a trapezoidal sectional shape, a width of which is made narrower toward the center wiring layer, respectively. Therefore, a warp of the substrate due to the via arrangement can be reduced.

The center wiring layer may be formed thicker than wiring patterns formed in the wiring layers stacked on one side and the other side of the center wiring layer. Therefore, a warp of the substrate can be suppressed by a shape keeping action of the center wiring layer.

According to the present invention, such a multilayer wiring substrate can be provided that a stress of the substrate can be equalized on one side and the other side of the center wiring layer, a reduction in thickness of the substrate can be achieved, and a warp of the substrate can be prevented.

Other features and advantages may be apparent from the following detailed description, the accompanying drawings and the claims.

DETAILED DESCRIPTION

First Embodiment

Multilayer Wiring Substrate

A first embodiment of a multilayer wiring substrate according to the present invention will be explained in detail with reference to the drawings hereinafter.

Figure 1:
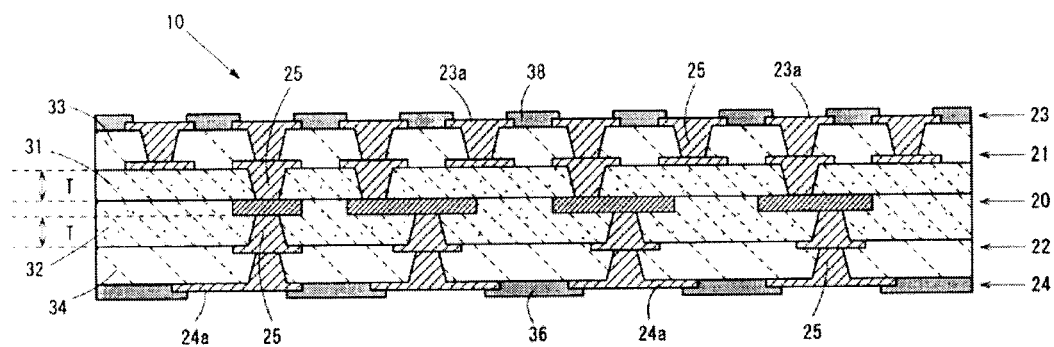
FIG. 1 is a sectional view showing a configuration of a first embodiment of a multilayer wiring substrate.

FIG. 1 is a sectional view showing a configuration of a first embodiment of a multilayer wiring substrate. A multilayer wiring substrate 10 of the present embodiment is constructed by stacking first, second, third, and fourth wiring layers 21, 22, 23, 24 on both sides of a center wiring layer 20 arranged at the center in the thickness direction of the substrate, while interposing insulating layers 31, 32, 33, 34 between these wiring layers. The multilayer wiring substrate 10 corresponds to the multilayer wiring substrate without the core substrate, which is equipped with four insulating layers and five wiring layers.

Figure 10:
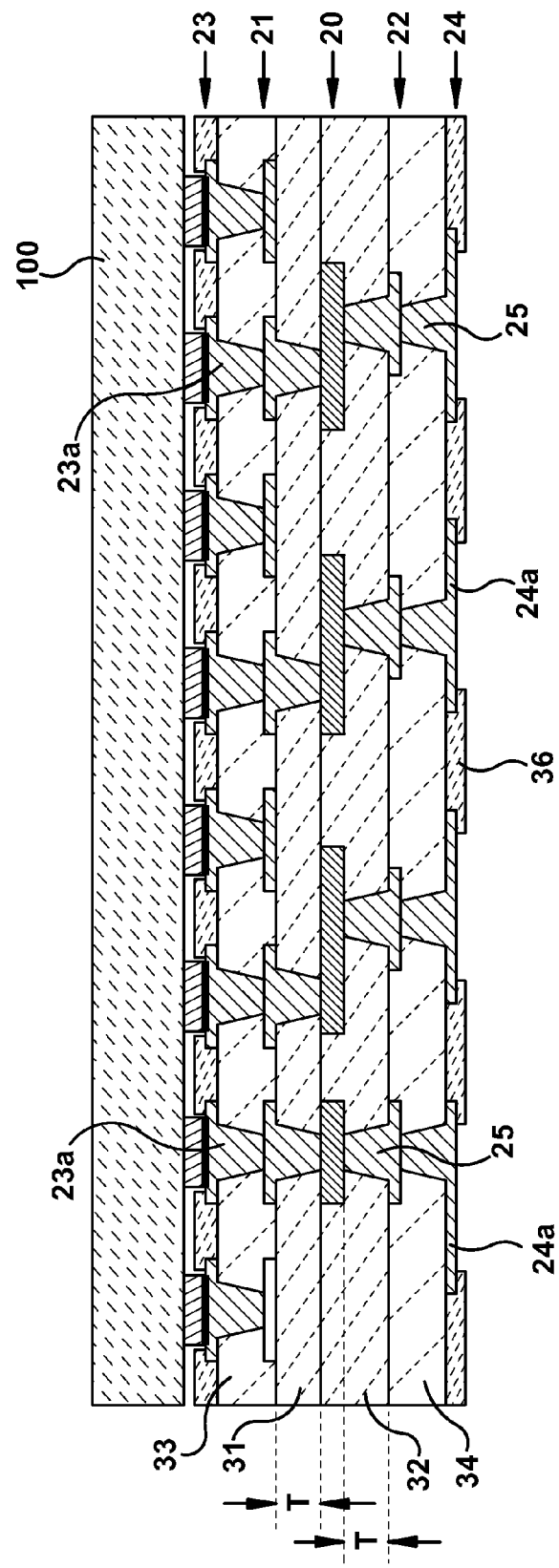
FIG. 10 is a sectional view showing the configuration of the first embodiment of the multilayer wiring substrate including a semiconductor element.

In FIG. 1, pads 23a to which a semiconductor element 100 mounted on the multilayer wiring substrate 10 (see FIG. 10) is connected are formed in the third wiring layer 23. Also, pads 24a to which an external connection terminal such as a solder ball, or the like is connected respectively are formed in the fourth wiring layer 24.

The wiring layers located adjacent to each other via the insulating layers 31 to 34 are connected electrically mutually via vias 25. Wiring patterns are formed in the wiring layers 20 to 24 based on a predetermined design, and the wiring patterns are connected electrically between the layers via the vias 25 provided in adequate positions.

Except the portions where the pads 23a, 24a are formed, a semiconductor element mounting surface and a surface, to which the external connection terminals are joined, of the multilayer wiring substrate 10 are covered and protected with protection films 36, 38, such as a solder resist, or the like.

Figure 2:
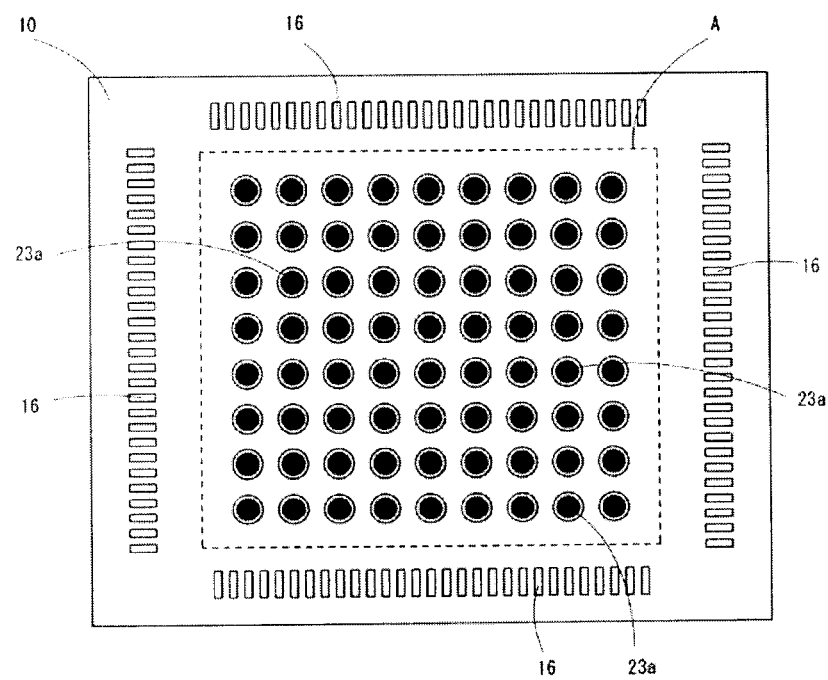
FIG. 2 is a plan view showing the multilayer wiring substrate of FIG. 1.

In FIG. 2, a plan view showing the multilayer wiring substrate 10 when viewed from the semiconductor element mounting surface side is shown. A semiconductor element mounting area A is provided in the center portion of the semiconductor element mounting surface of the multilayer wiring substrate 10, and the pads 23a are provided in the semiconductor element mounting area A in grid-like arrangement. Pads 16 used in the wire bonding connection are provided in a peripheral portion of the semiconductor element mounting area A. In this case, arrangement of the pads 23a, etc. of the multilayer wiring substrate 10 is varied depending on the product, and FIG. 2 shows an example of arrangement of the pads 23a, etc.

One of features of the multilayer wiring substrate 10 resides in that equal numbers of the wiring layers and the insulating layers are provided on both sides of the center wiring layer 20 respectively.

In the present embodiment, two wiring layers (the first wiring layer 21 and the third wiring layer 23) are provided on one side (side on which the semiconductor element 100 is mounted) of the center wiring layer 20, and also two wiring layers (the second wiring layer 22 and the fourth wiring layer 24) are provided on the other side (side on which the external connection terminals are joined). Also, two insulating layers 31, 33 are provided on one side of the center wiring layer 20, and two insulating layers 32, 34 are provided on the other side.

Out of the insulating layers 31 to 34, a thickness of the insulating layer 31 of the inner insulating layers 31, 32 is set thinner than that of the insulating layer 32. This is because the center wiring layer 20 should be embedded in the insulating layer 32 (on the lower side) on account of manufacturing steps and thus a thickness of the insulating layer 32 (thickness T in FIG. 1) except a thickness of the center wiring layer 20 should be set to coincide with a thickness of the insulating layer 31 (on the upper side).

The insulating layer 31 and the insulating layer 32 are integrated by the thermal press. Therefore, when respective portions of the insulating layer 31 and the insulating layer 32 except the thickness of the center wiring layer 20 are set equal in thickness to each other, the center wiring layer 20 is arranged in the center position (middle position) between the insulating layer 31 and the insulating layer 32 in the thickness direction of the insulating layers. That is, the center wiring layer 20 is arranged such that this layer is balanced and put between the insulating layer 31 and the insulating layer 32.

As described above, in the multilayer wiring substrate 10 without the core substrate, such a problem exists that the substrate is ready to warp. The reason why thicknesses of the insulating layers 31, 32 arranged on both sides of the center wiring layer 20 in the thickness direction are set commonly is that the characteristics associated with a warp of the substrate are balanced as many as possible to reduce the influence that acts on a warp of the multilayer wiring substrate.

In the present embodiment, thicknesses of the insulating layers 33, 34 stacked on the insulating layers 31, 32 respectively are also set equal to each other, and also respective thicknesses of the insulating layers 31, 33 located on one side and the insulating layers 32, 34 located on the other side, which are arranged to put the center wiring layer 20 therebetween, are set commonly as a whole, so that the thicknesses of the insulating layers 31 to 34 are balanced.

As the insulating layers 31 to 34, a resin material for building-up, a resin in which reinforcement such as a glass cloth, or the like can be employed. In the present embodiment, an epoxy resin in which a glass cloth is contained is employed as the resin material constituting the inner insulating layers 31, 32, and an epoxy resin in which no glass cloth is contained is employed as the outer insulating layers 33, 34.

The reason why an epoxy resin containing a glass cloth is employed is that a total strength of the multilayer wiring substrate 10 should be ensured by enhancing a strength of the inner insulating layers 31, 32, and also occurrence of a warp of the substrate should be suppressed. As the resin material for enhancing the strength of the inner insulating layers, the resin material into which glass cloth (woven fabric), glass nonwoven fabric, aramid nonwoven fabric, liquid crystal polymer nonwoven fabric, or the like is mixed as the reinforcement can be employed. As the resin component, a BT resin, or the like may be employed in addition to the epoxy resin.

The resin material in which the glass cloth is contained has a larger reinforcing action than that of the resin material such as the building-up resin, or the like, in which the reinforcement is not mixed. However, the resin material containing the glass cloth is not suitable for the case where the via holes are formed at a high density or the case where the wirings are formed at a fine pitch. The wiring patterns formed on the inner insulating layers 31, 32 of the multilayer wiring substrate 10 have a wider wiring interval and a lower wiring density than those of the wiring patterns formed on the outer insulating layers (particularly, on the side on which the semiconductor element 100 is mounted) of the multilayer wiring substrate 10. Therefore, when the resin material containing the glass cloth is utilized as the inner insulating layers, there can be achieved such an advantage that the problems caused in the manufacturing steps of forming the wiring patterns become small.

In contrast, the wiring patterns in the outer insulating layers of the multilayer wiring substrate 10 are arranged at a higher density than that of the inner insulating layers. Therefore, the resin material not containing the glass cloth should be employed particularly as the insulating layer 33 on the side on which the semiconductor element 100 is mounted to allow the high-density wirings. From a viewpoint of balance of the insulating layers, the insulating layer 34 on the side on which the external connection terminals are formed should be formed of the same resin material as the insulating layer 33.

In this case, all the insulating layers can be formed by the same type resin material such that all the insulating layers 31 to 34 of the multilayer wiring substrate 10 are formed of the resin material containing the reinforcement such as the glass cloth, or the like, all the insulating layers 31 to 34 are formed of the resin material not containing the reinforcement, or the like. Also, the insulating layer formed of the resin material containing the reinforcement can be employed as the insulating layer on the outer layer side of the substrate. In this case, the insulating layer containing the reinforcement should be applied to the insulating layers that are located in symmetrical positions on one side and the other side of the center wiring layer 20 such that the arrangements of the insulating layers are balanced as a whole substrate on one side and the other side of the center wiring layer 20.

In the case of the multilayer wiring substrate in which the number of the insulating layers and the wiring layers is in excess of six layers, the layers can be constructed by using not only one or two types of resin materials but also three types of resin materials whose physical properties such as strength, and the like are different. In such case, the substrate should be constructed by choosing the resin material to get an equal balance over the whole substrate.

Another feature of the multilayer wiring substrate 10 of the present embodiment resides in that a sectional shape of the vias 25, which are formed in the insulating layers 31 to 34 on both sides of the multilayer wiring substrate 10, are formed such that respective shapes of the vias 25 on one side and the other side between which the center wiring layer 20 is located become symmetrical. As shown in FIG. 1, a sectional shape of the via 25 is formed like a trapezoidal shape. In the multilayer wiring substrate 10, the via 25 on the upper side (side on which the semiconductor element 100 is mounted) with respect to the center wiring layer 20 is formed like a so-called inverse trapezoidal shape whose upper base is longer than a lower base. On the contrary, the via 25 on the lower side (side on which the external connection terminals are joined) with respect to the center wiring layer 20 is formed like a so-called trapezoidal shape whose upper base is shorter than a lower base.

In this manner, the vias 25 are formed such that respective sectional shapes of the vias 25, which are formed in the insulating layers 31, 33 located on one side, and the vias 25, which are formed in the insulating layers 32, 34 located on the other side, become symmetrical with respect to the center wiring layer 20. As a result, a warp of the substrate caused due to the event that the shapes (sectional shapes) of the vias 25 located on one side and the other side become asymmetrical with respect to the center wiring layer 20 can be suppressed, and also the planarization of the substrate can be achieved.

Except the case of a special design, normally the wiring patterns of the wiring layers 20 to 24 formed on the multilayer wiring substrate 10 are not perfectly symmetrically arranged to put the center wiring layer 20 therebetween. Also, the positions of the vias 25 formed in the insulating layers 31 to 34 are arranged differently layer by layer. In this manner, the arrangement of the conductor portions (the wiring patterns, the vias) in the multilayer wiring substrate 10 is out of perfect symmetry with respect to the center wiring layer 20. In such case, the symmetrical arrangement of the vias 25 with respect to the center wiring layer 20 contributes to the action of balancing the conductor portions and can suppress a warp caused on the multilayer wiring substrate 10.

Here, a thickness of the wiring patterns formed in the wiring layers 20 to 24 is set to about 5 to 15 μm, and a height of the via portions is set to about 40 μm. A total thickness of the multilayer wiring substrate 10 of the present embodiment, in which the insulating layers are formed as a four-layer structure, becomes about 250 μm. A thickness of the insulating layers and a thickness of the wiring patterns can be set appropriately, and the number of the stacked wiring layers and the stacked insulating layers of the multilayer wiring substrate can be set arbitrarily. As a result, a total thickness of the multilayer wiring substrate is varied depending on a change in the stacked number of the wiring layers and the insulating layers.

(Example of Another Multilayer Wiring Substrate)

Figure 3:
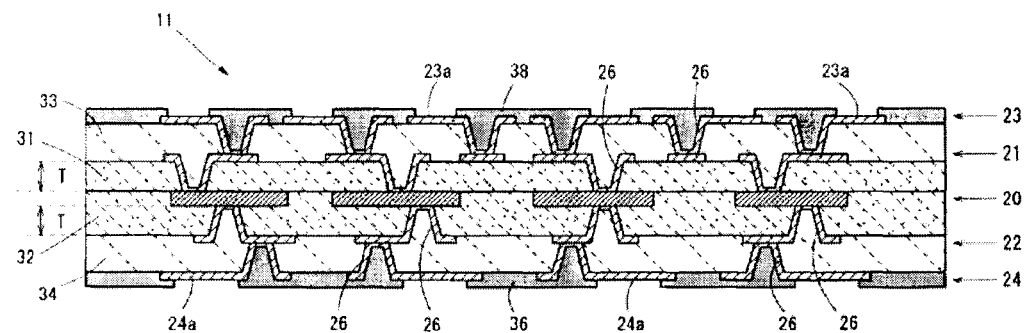
FIG. 3 is a sectional view showing a configuration of a modified example of the first embodiment of the multilayer wiring substrate.

In the multilayer wiring substrate 10 shown in FIG. 1, the vias 25 are formed as the filled via. FIG. 3 shows an example of a multilayer wiring substrate 11 in which the wiring layers are connected electrically by vias 26 whose upper portion (large diameter side) is opened.

Such situations are similar to those in the above embodiment that the number of the wiring layers 21, 23 and the insulating layers 31, 33 formed on one side of the center wiring layer 20 are set to coincide with the number of the wiring layers 22, 24 and the insulating layers 32, 34 formed on the other side, and that thicknesses of the insulating layers 31, 33 on one side and thicknesses of the insulating layers 32, 34 on the other side are set symmetrically with respect to the center wiring layer 20 in the thickness direction. Also, in the multilayer wiring substrate 11 in the illustrated example, the inner insulating layers 31, 32 are formed by the epoxy resin containing the glass cloth such that the multilayer wiring substrate 11 can have a predetermined strength.

In the multilayer wiring substrates 10, 11, except the center wiring layer 20, the wiring layers and the insulating layers arranged on both sides of the center wiring layer 20 are formed as two layers respectively, i.e., as four layers in total. When the larger number of wiring layers and insulating layers are formed, the numbers of the wiring layers and the insulating layers arranged on one side of the center wiring layer 20 are set equal to those of the wiring layers and the insulating layers arranged on the other side. For example, the wiring layers and the insulating layers on one side and the other side of the center wiring layer 20 are formed as three layers (six layers in total), four layers (eight layers in total), and five layers (ten layers in total) respectively.

In this manner, since the number of wiring layers and the number of insulating layers on one side of the center wiring layer 20 and the other side are made to coincide with each other, respective stresses caused on one side and the other side of the multilayer wiring substrate can be balanced and thus a warp of the multilayer wiring substrate can be suppressed. Also, since the multilayer wiring substrate is formed in larger layer number, the strength of the multilayer wiring substrate can be improved as a whole and accordingly a warp of the multilayer wiring substrate can be suppressed.

Figure 4:
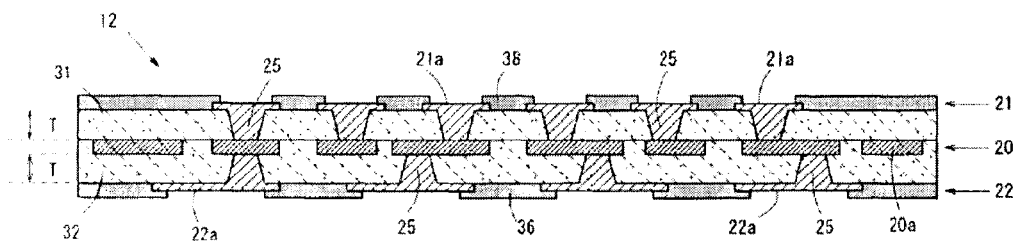
FIG. 4 is a sectional view showing a configuration of a further modified example of the first embodiment of the multilayer wiring substrate.

FIG. 4 is an example of a multilayer wiring substrate 12 in which the insulating layers 31, 32 are formed as a single layer alternatively on both sides of the center wiring layer 20 and then the wiring layers 21, 22 are formed as a single layer on the insulating layers 31, 32 respectively. This multilayer wiring substrate 12 consists of three wiring layers containing the center wiring layer 20 and two insulating layers, and shows an example in which the numbers of wiring layers and insulating layers are set at a minimum. In FIG. 4, pads 21a to which a semiconductor element mounted on the multilayer wiring substrate 12 is connected are formed in the wiring layer 21. Also, pads 22a to which an external connection terminal such as a solder ball, or the like is connected respectively are formed in the wiring layer 22.

Such situations are similar to those in the above embodiments that respective thicknesses of the insulating layers 31, 32 are set equal (thickness T) with respect to the center wiring layer 20, and that the center wiring layer 20 and the wiring layers 21, 22 are connected electrically mutually via the vias 25.

In the multilayer wiring substrate 12 of the present embodiment, the number of wiring layers and insulating layers is small. Therefore, the strength of the substrate is lowered rather than the multilayer wiring substrate in which the larger number of layers is formed, and there is a possibility that the substrate is ready to warp. Such an approach is effective for this problem that the insulating layers 31, 32 are formed by the resin material such as the epoxy resin containing the glass cloth, or the like, which has a predetermined strength (shape keeping property), to ensure a predetermined strength.

Also, such another approach is effective to suppress a warp of the substrate that a function of a reinforcing action (shape keeping action) to prevent a warp of the substrate as well as a function of the wiring pattern, which is arranged in the middle between the wiring layers 21, 22, is attached to the center wiring layer 20 that is arranged in the center of the substrate in the thickness direction.

When the center wiring layer 20 is used to have only the function of the wiring pattern, about 10 µm is enough for a thickness of the conductor layer. When the center wiring layer 20 is also used to have the reinforcing function of the substrate, a thickness of the center wiring layer 20 is made thick up to about 30 µm. When a thickness of the conductor layer is increased, such a requirement is restricted that the interval between the wiring patterns should be narrowed. Therefore, the thickness of the conductor layer is set while taking the interval between the wiring patterns, which are formed in the center wiring layer 20, into consideration.

Also, when relatively wide empty areas in which no wiring pattern is arranged are produced in the situation that the wiring patterns are formed in the center wiring layer 20, a dummy pattern 20a should be formed in the empty areas respectively such that the conductors are arranged (distributed) equally as a whole in the planar area of the center wiring layer 20. When the arrangement of the conductors in the center wiring layer 20 is designed in this manner, a warp of the center wiring layer 20 itself can be suppressed and also an action of the center wiring layer 20 to suppress a warp of the substrate can be effectively exerted. The dummy pattern 20a can be utilized as a ground pattern, or the like.

The method of providing the shape keeping function to the center wiring layer 20 to suppress a warp of the substrate is not limited the case where the insulating layer is formed as two layers. Such method can be applied to the multilayer wiring substrate in which the insulating layer is formed in larger layer number.

Second Embodiment

Multilayer Wiring Substrate

Figure 5:
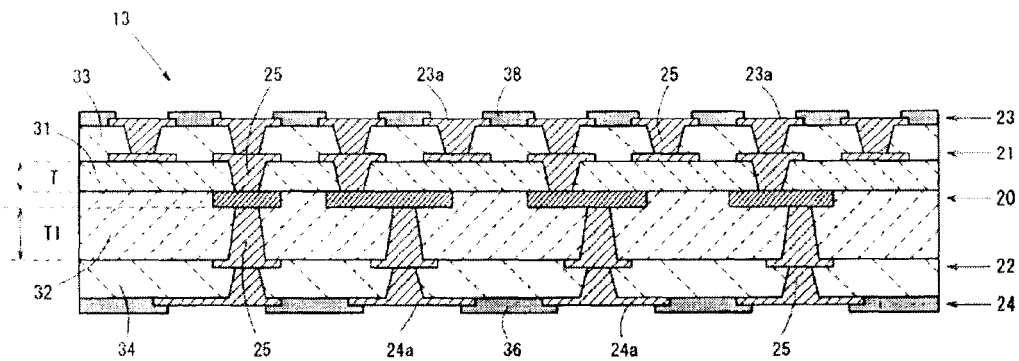
FIG. 5 is a sectional view showing a configuration of a second embodiment of a multilayer wiring substrate.

FIG. 5 shows a configuration of a second embodiment of the multilayer wiring substrate. In a multilayer wiring substrate 13, such a configuration is similar to the multilayer wiring substrate 10 shown in FIG. 1 that the wiring layers 21, 23 and the insulating layers 31, 33 are provided on one side of the center wiring layer 20 and also the wiring layers 22, 24 and the insulating layers 32, 34 are provided on the other side.

Also, it is similar to the first embodiment that the resin material of the same material quality is employed as the inner insulating layers 31, 32. A characteristic configuration of the multi layer wiring substrate 13 of the present embodiment resides in that a thickness of the insulating layer 32 on the other side is set thicker that a thickness of the insulating layer 31 on one side and thus the inner insulating layers 31, 32 are positively set to a different thickness respectively. In FIG. 5, the insulating layer 31 and the insulating layer 32 are formed to satisfy T1>T, where T is a thickness of the insulating layer on one side of the center wiring layer 20 and T1 is a thickness of the insulating layer on the other side.

The reason why a thickness of the insulating layer on the other side of the center wiring layer 20 is set thicker that a thickness of the insulating layer 31 on one side resides is that the stresses caused by the insulating layers 31, 32 and the insulating layers 32, 34 respectively are positively made uneven (unbalanced state) on one side and the other side of the center wiring layer 20 such that a warp can be suppressed as a whole of the multilayer wiring substrate 13 by utilizing a warping stress caused due to the insulating layers 31 to 34.

As described above, the arrangements of the wiring patterns and the vias formed in the wiring layer of the multilayer wiring substrate are never perfectly identical in respective layers, and also the conductor portions that are formed in the multilayer wiring substrate and still left on the substrate are not perfectly equally distributed in all layers. For this reason, even when the insulating layers are formed on one side and the other side of the center wiring layer 20 while keeping balances of the thicknesses and the material quality, such a phenomenon takes place that the substrate is warped due to the stress caused by the event that the conductor portions in the substrate is not perfectly balanced.

In the present embodiment, a thickness of the insulating layer 32 is set thicker than a thickness of the insulating layer 31, and a stress balance due to the insulating layers 31 to 34 is set in an unbalanced state. The reason for these settings is that the stress caused by the unbalance of the distribution of the conductors in the multilayer wiring substrate 13 should be cancelled, and a warp should be suppressed as a whole of the multilayer wiring substrate 13.

Normally, the wiring patterns on the side on which the semiconductor element is mounted (one side of the center wiring layer 20) are formed at a higher density than the wiring patterns on the side onto which the external connection terminals are joined (the other side of the center wiring layer 20). As a result, the multilayer wiring substrate is warped such that the side on which the semiconductor element is mounted is convex downward or convex upward (when the thicknesses of the insulating layers are balanced). The warping direction of the substrate is not uniquely decided because of the arrangement of the conductors and the characteristic of the insulating layers.

When a thickness of the insulating layer formed on the side on the side onto which the external connection terminals are joined is increased or when a thickness of the insulating layer formed on the side on which the semiconductor element is mounted is increased in the situation that the distribution of the conductor portions is set equally, the insulating layer itself can be warped such that this layer is convex upward or convex downward.

Accordingly, when a warp due to the unbalance of the distribution of the conductor portions in the multilayer wiring substrate 13 is canceled by utilizing the stress caused by making the thicknesses of the insulating layers unequal, a warp of the multilayer wiring substrate 13 can be suppressed as a whole. The multilayer wiring substrate 13 shown in FIG. 5 gives an example in which thicknesses of the insulating layers are set in view of the distribution of the conductor portions, a warp of the multilayer wiring substrate 13 can be suppressed as a whole, and the substrate is planarized.

The arrangement of the wiring patterns and the vias in the multilayer wiring substrate is varied according to the product, and an amount of warp due to the distribution of the conductor portions in the multilayer wiring substrate is different. Therefore, each product is designed such that a warp of the multilayer wiring substrate is minimized as a whole by adjusting the thicknesses of the insulating layers.

Figure 6:
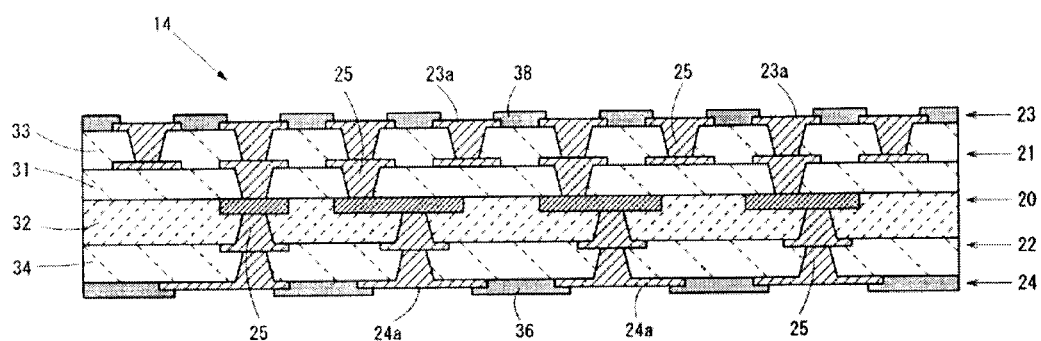
FIG. 6 is a sectional view showing a configuration of a modified example of the second embodiment of the multilayer wiring substrate.

FIG. 6 shows an example of a multilayer wiring substrate 14 in which the insulating layer 32 formed of the different type of resin material from the resin material employed as the insulating layer 31 is provided, as the method of unbalancing the stress caused due to the insulating layers 31 to 34, not to change the thicknesses of the inner insulating layers 31, 32. The multilayer wiring substrate 14 is formed by the method that employs the epoxy resin not containing the glass cloth as the insulating layer 31 and employs the epoxy resin containing the glass cloth as the insulating layer 32, for example.

In this manner, according to the method of employing the resin material having the different material qualities (elastic modulus, coefficient of thermal expansion) as the insulating layers 31, 32, the multilayer wiring substrate can be designed such that the stresses caused by the insulating layers 31 to 34 themselves can be made unbalance and also a warp of the whole multilayer wiring substrate 13 can be suppressed.

The multilayer wiring substrate 13 has four insulating layers 31 to 34. The application of the method of causing positively a warp due to the insulating layers 31 to 34 themselves by changing the thicknesses of the insulating layers or changing the material quality of the insulating layers is not limited to the inner insulating layers 31, 32.

For example, all layers of the insulating layers 31 to 34 can be formed to have a different thickness mutually or can be formed of a different material quality mutually. Also, both a thickness and a material quality of the particular insulating layer can be changed, otherwise combinations in which the resin material and the thickness are varied can be employed, e.g., the particular insulating layer is formed to have a thickness different from other insulating layers and remaining particular insulating layer is formed of the material quality different from other insulating layers.

The insulating layer in the multilayer wiring substrate can be formed in multiple layer number that is in excess of six layers. In the case of the substrate having such multiplayer structure, the method of utilizing positively the warping stress of the insulating layer itself by choosing a thickness and a material quality of the insulating layer can be designed by using a wider variety of combinations. Also, a warp of the substrate can be suppressed by providing an adequate means as the method of suppressing a warp of the multilayer wiring substrate.

(Method of Manufacturing Multilayer Wiring Substrate)

FIGS. 7A to 7D shows a method of manufacturing the multilayer wiring substrate 10 shown in FIG. 1.

Figure 7A:
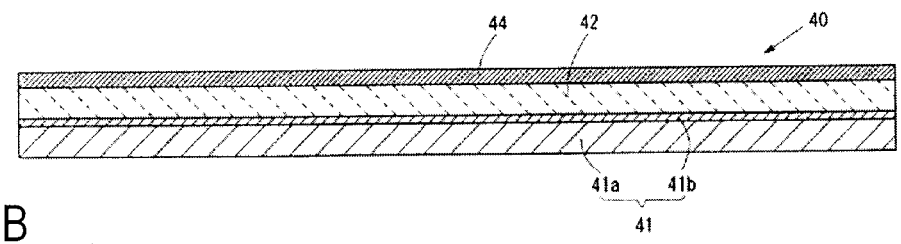
FIGS. 7A to 9 show a method of manufacturing the multilayer wiring substrate shown in FIG. 1.

FIG. 7A shows a state that a stacked body 40 is formed. In the stacked body 40, a copper foil 44 is formed on a surface, on which a metallic foil 41b is deposited, of a metallic foil with carrier 41 via an insulating layer 42. The stacked body 40 is formed by applying a heat and a pressure to the copper foil 44 on the metallic foil 41b of the metallic foil with carrier 41 via a thermosetting resin film that is kept in a semi-cured state. The thermosetting resin film is thermally cured by the thermal bonding, and thus the insulating layer 42 is formed.

The copper foil 44 serves as the center wiring layer of the multilayer wiring substrate when this foil is patterned into a predetermined pattern in the later step, and the insulating layer 42 serves as the insulating layer located adjacent to the center wiring layer.

Accordingly, when a predetermined strength (shape keeping property) is given to the center wiring layer to suppress a warp of the substrate, a copper foil of predetermined thickness (about 20 to 50 μm) is employed for copper foil 44.

When a predetermined strength is required for the insulating layer 42 to prevent a warp of the substrate, a resin film containing the reinforcement such as the epoxy resin containing the glass cloth, or the like is employed. Also, since a thickness of the insulating layer 42 has an influence on a warp of the substrate, a resin film of appropriate thickness is chosen and employed.

The metallic foil with carrier 41 is formed by depositing the metallic foil 41b on one surface side of a carrier plate 41a via a peeling layer. A copper plate of 14 to 70 μm thickness is employed as the carrier plate 41a, and a copper foil of 1 to 10 μM thickness is employed as the metallic foil 41b.

The metallic foil 41b is patterned in the later step, and is shaped in the wiring patterns of the wiring layers except the center wiring layer of the multilayer wiring substrate.

Figure 7B:
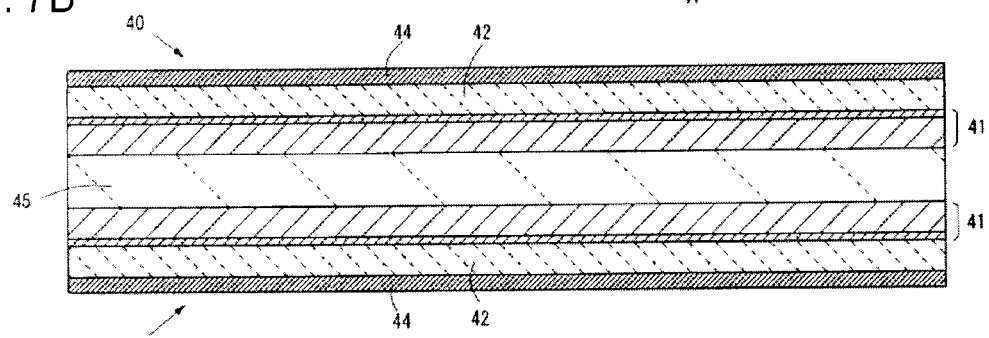

Then, a pair of stacked bodies 40 are arranged oppositely, and adhered by a joining layer 45 that is formed of a thermosetting sheet in a semi-cured state (FIG. 7B). The stacked bodies 40 are joined integrally by opposing the metallic foils with carrier 41 of the stacked bodies 40 to the joining layer 45 and then pressing the joining layer 45 by the stacked body 40 from both sides while heating them. The copper foil 44 is exposed from both surfaces of the joined body.

Figure 7C:
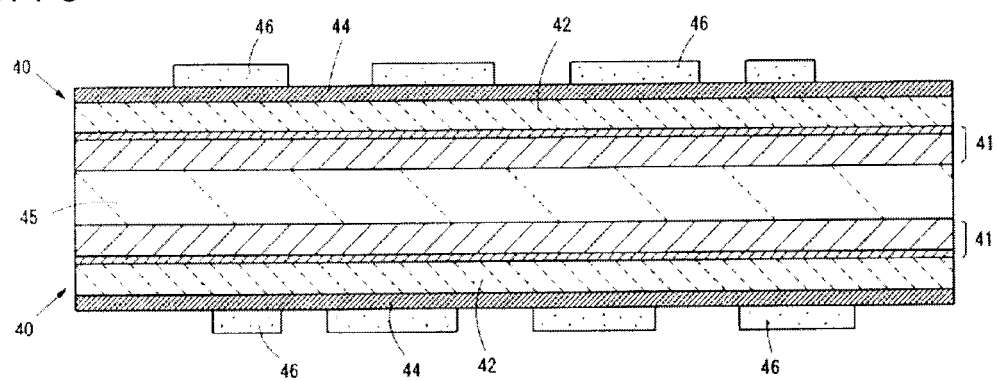

Then, a surface of the copper foil 44 is covered with a resist 46 to pattern the copper foil 44, and then the resist pattern for covering portions of the copper foil 44, which are left as the wiring layers, is formed by exposing/developing the resist 46 (FIG. 7C). The resist pattern is patterned on the copper foil 44 on both an upper surface and a lower surface. The copper foil 44 serves as the center wiring layer 20 of the multilayer wiring substrate 10, and the resist 46 is patterned in accordance with the wiring pattern in the center wiring layer 20.

Figure 7D:
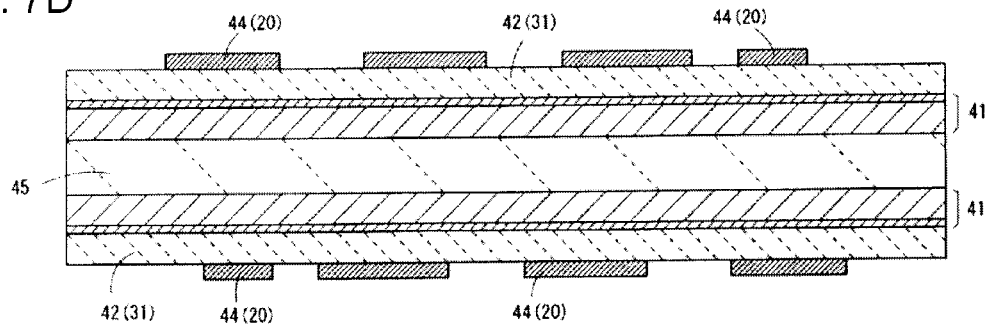

FIG. 7D shows a state that the copper foil 44 on both surfaces of the joined body is patterned while using the resist 46 as a mask and the resist 46 is removed. In this step, the copper foil 44 is patterned on a surface of the insulating layer 42 in a predetermined pattern. The patterned copper foil 44 corresponds to the center wiring layer 20. The insulating layer 42 corresponds to the insulating layer 31 that supports the center wiring layer 20.

In the present embodiment, the center wiring layer 20 is patterned/formed by the subtractive process. Also, the center wiring layer 20 can be patterned/formed by the semi-additive process.

Figure 8A:
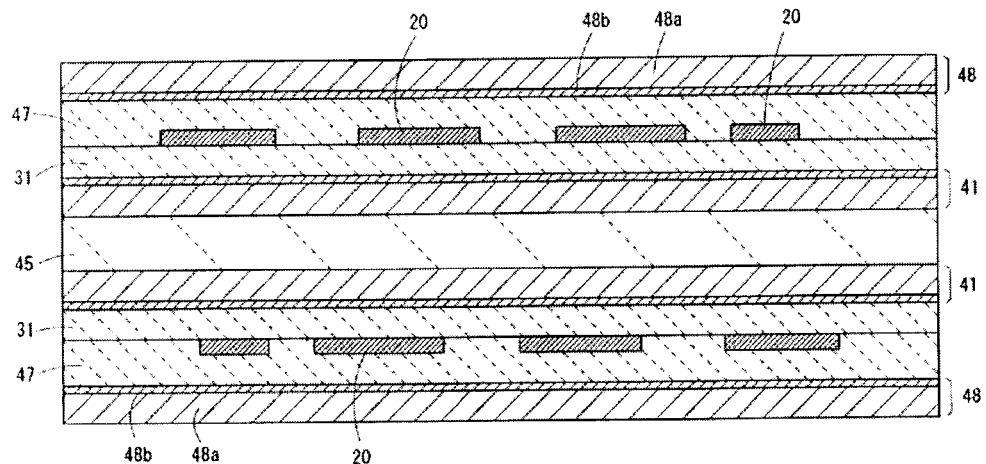

FIG. 8A shows a state that a joined body is formed by depositing a metallic foil with carrier 48 on both surfaces of the joined body, in which the center wiring layer 20 is formed, via an insulating layer 47. The metallic foil with carrier 48 is joined by applying a heat and a pressure via a thermosetting resin film. The thermosetting resin film used to join the metallic foil with carrier 48 serves as the insulating layer 32 that is deposited on the center wiring layer 20 of the multilayer wiring substrate 10. As the thermosetting resin film, the resin film having the thickness and the material quality, which are decided based upon the design of the insulating layer 32, is employed. The metallic foil with carrier 48 is constructed by providing a peeling layer between a metallic foil 48b and a carrier plate 48a.

Then, the jointed body shown in FIG. 8A is separated at boundary surfaces (peeling layers) between the metallic foils 41b, 48b and the carrier plates 41a, 48a of the metallic foils with carrier 41, 48.

As to the metallic foil with carrier 48 located as the outermost layer, the carrier plate 48a is peeled off, and the metallic foil 48b is adhered onto the insulating layer 47. The insulating layer 47 corresponds to the insulating layer 32 of the multilayer wiring substrate 10.

As to the inner metallic foil with carrier 41, the carrier plate 41a is joined to the joining layer 45, and the metallic foil 41b is adhered onto the insulating layer 31.

Figure 8B:
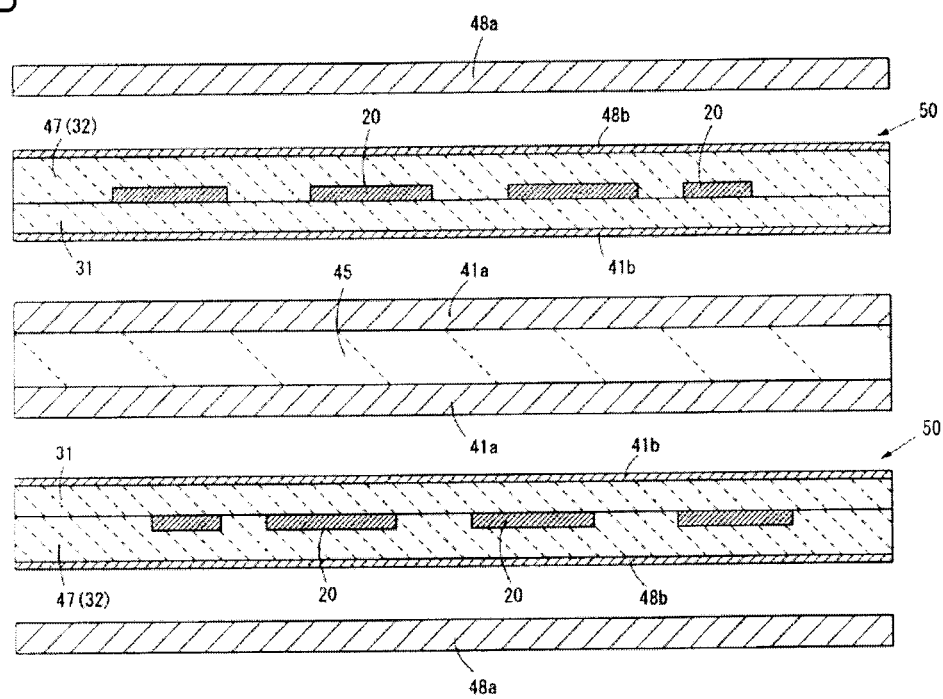

In this manner, two sets of stacked bodies 50 in which the center wiring layer 20 is put between the insulating layers 31, 32 and the metallic foils 41b, 48a are adhered onto outer surfaces of the insulating layers 31, 32 are obtained (FIG. 8B).

FIGS. 9A to 9E show steps of forming the wiring layer on the stacked body 50. In forming the wiring layer on the stacked body 50, the method applied in the related art as the method of manufacturing the wiring substrate such as the building-up method, or the like may be applied.

The method of forming the wiring layer by the semi-additive process is illustrated hereunder.

Figure 9A:
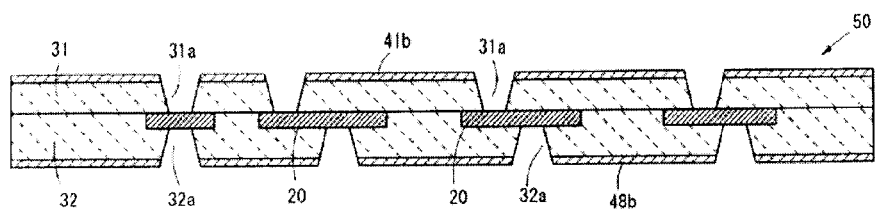

FIG. 9A shows a state that via holes 31a, 32a are formed in the insulating layers 31, 32 by the laser beam machining. The via holes 31a, 32a are formed such that the center wiring layer 20 is exposed from the inner bottom surfaces. After the via holes 31a, 32a are formed, the desmear process is applied as the case may be.

Figure 9B:
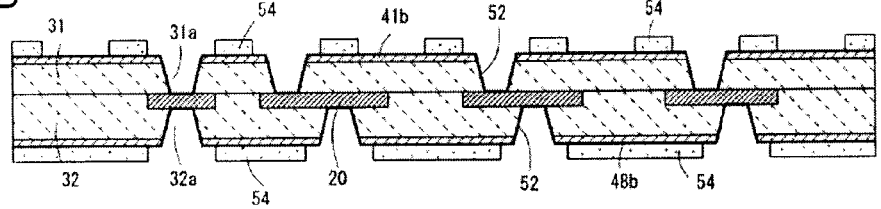

FIG. 9B shows a state that a plating seed layer 52 is formed by applying the electroless copper plating, or the like to both surfaces of the stacked body 50, and a resist pattern 54 is formed in accordance with the wiring pattern in the wiring layers 21, 22. The resist pattern 54 is formed such that the portions serving as the wiring patterns are exposed.

In forming the via holes 31a, 32a, the via hole processing can be applied in a state that the metallic foils 41b, 48b are deposited on the insulating layers 31, 32, or the via hole processing can be applied after the metallic foils 41b, 48b are removed by the etching.

Figure 9C:
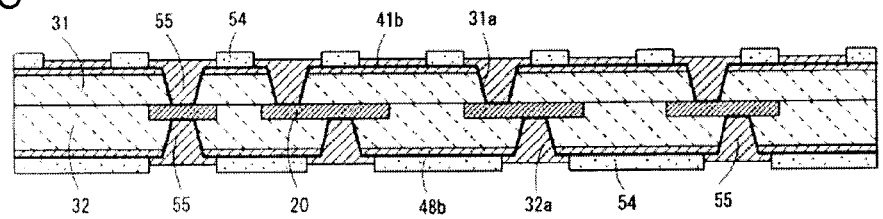

FIG. 9C shows a state that a copper plating 55 is formed on the plating seed layer 52, which is not covered with the resist pattern 54, to rise up by applying the copper electrolytic plating while using the plating seed layer 52 as a plating power feeding layer. The (filled via) plating can be applied by setting the plating conditions such that the via holes 31a, 32a are filled with the copper plating 55.

Figure 9D:
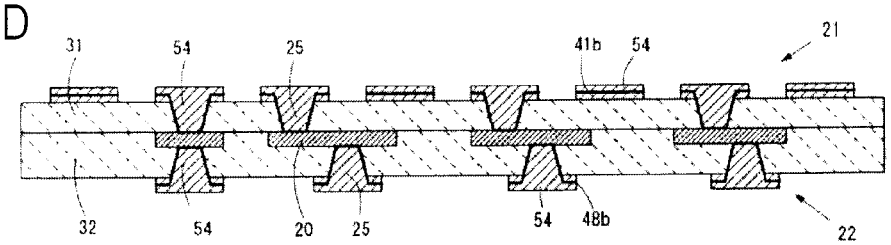

Then, the resist pattern 54 is removed, then exposed portions of the plating seed layer 52 and portions of the underlying metallic foils 41b, 48a are removed selectively by the etching, and then the wiring layers 21, 22 are formed to form the wiring patterns as the independent patterns (FIG. 9D). The exposed portions of the plating seed layer 52 and the portions of the underlying metallic foils 41b, 48a are thinner considerably than a thickness of the copper plating 55 that is formed by the copper electroplating to rise up, and can be removed selectively by the chemical etching process.

FIG. 9D shows a state that the wiring patterns in the wiring layers 21, 22 are connected electrically to the center wiring layer 20, which is put between the insulating layers 31, 32, via the vias 25 that are formed of the copper plating 55.

Figure 9E:
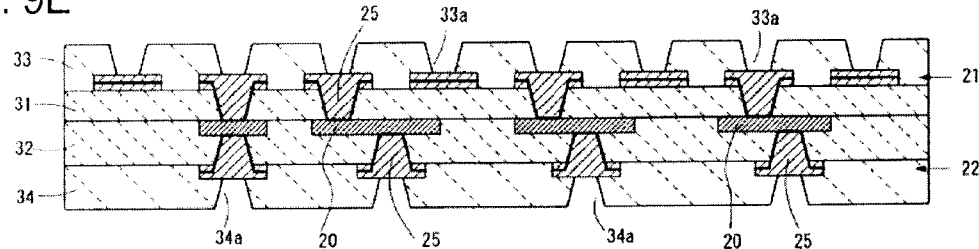

As shown in FIG. 9E, the insulating layers 33, 34 and the wiring layers 23, 24 may be formed on the wiring layers 21, 22, like the method by which the insulating layers 33, 34 are formed by stacking a resin film on the insulating layers 31, 32 and also the wiring layers 21, 22 are formed by forming via holes 33a, 34a in the insulating layers 33, 34 by the laser beam machining. As the resin film acting as the insulating layers 33, 34, a resin film of predetermined thickness and material is employed while considering a warp of the substrate, etc.

In this manner, the multilayer wiring substrate 10 shown in FIG. 1 can be manufactured. The vias 25 formed in the insulating layers 31 to 34 are arranged such that their trapezoidal sectional shapes are positioned symmetrically with respect to the center wiring layer 20 on one side and the other side.

Also, when a thickness and a material quality of the resin films used as the insulating layers are adequately chosen respectively, the insulating layers 31, 32, 33, 34 are formed to select their thicknesses, and the like based on the insulating layer design that is prepared to take a warp of the substrate into account.

FIGS. 9A to 9E show the example in which the wiring layers are formed by the semi-additive process. But the wiring layers can be formed by the subtractive process other than the semi-additive process. Also, in the above example, on account of the utilization of the metallic foil with carrier, a set of stacked bodies 50 can be manufactured in one manufacturing step and also a warp of the substrate in the manufacture can be suppressed. But the method of forming the stacked body 50 is not limited to the above method.

The foregoing method of manufacturing the multilayer wiring substrate makes it possible to adjust a thickness of the center wiring layer of the multilayer wiring substrate and a thickness of the insulating layer of the multilayer wiring substrate and to form the multilayer wiring substrate while choosing appropriately the resin material used as the insulating layer, and can be utilized preferably as the method of manufacturing the multilayer wiring substrate according to the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A multilayer wiring substrate, comprising:
    a center wiring layer arranged in a center of the substrate in a thickness direction;
    wiring layers stacked on a first side of the center wiring layer via insulating layers and forming a semiconductor element mounting surface of the multilayer wiring substrate, the semiconductor element mounting surface configured to have an associated semiconductor element mounted thereon, and wiring layers stacked on a second side of the center wiring layer via insulating layers and forming a surface of the multilayer wiring substrate opposite to the semiconductor element mounting surface; and
    a plurality of vias, the plurality of vias electrically connecting adjacent wiring layers including the center wiring layer to each other, said vias each having a trapezoidal sectional shape with a narrow end nearer the center wiring layer than a wide end,
    wherein the wiring layers on the first side of the center wiring layer and the wiring layers on the second side of the center wiring layer are provided in a same layer number,
    the insulating layers on the first side of the center wiring layer and the insulating layers on the second side of the center wiring layer are provided in a same layer number,
    the insulating layers located in symmetrical positions with respect to the center wiring layer are formed on the first side and the second side of the center wiring layer such that stresses caused by the insulating layers formed on the first side and the second side of the center wiring layer are made uneven,
    the multilayer wiring substrate is planarized in which stresses caused by an uneven distribution of conductors in the wiring layers formed on the first side and the second side of the center wiring layer are cancelled by the insulating layers, and
    a number of vias connecting the wiring layers stacked on the first side of the center wiring layer and provided between the center wiring layer and the semiconductor element mounting surface is greater than a number of vias connecting the wiring layers stacked on the second side of the center wiring layer and provided between the center wiring layer and the surface of the multilayer wiring substrate opposite to the semiconductor element mounting surface,
    wherein the center wiring layer is formed thicker than wiring patterns formed in the wiring layers stacked on the first side and the second side of the center wiring layer.

2. A multilayer wiring substrate according to claim 1, wherein the insulating layers located in symmetrical positions with respect to the center wiring layer on the first side and the second side of the center wiring layer respectively have equal thickness.

3. A multilayer wiring substrate according to claim 2, wherein the insulating layers located in symmetrical positions with respect to the center wiring layer are formed of a resin material into which reinforcement is mixed.

4. A multilayer wiring substrate according to claim 1, wherein the insulating layers located adjacent to the center wiring layer on the first side and the second side of the center wiring layer respectively are formed of a resin material into which reinforcement is mixed, and
    the insulating layers located in outer layers than the insulating layers located adjacent to the center wiring layer are formed of a resin material into which no reinforcement is mixed.

5. A multilayer wiring substrate according to claim 1, wherein the insulating layers located in symmetrical positions with respect to the center wiring layer are formed to have an unequal thickness on the first side and the second side of the center wiring layer respectively.

6. A multilayer wiring substrate according to claim 1, wherein the insulating layers located in symmetrical positions with respect to the center wiring layer are formed of a different type of insulating material on the first side and the second side of the center wiring layer respectively.

7. A multilayer wiring substrate according to claim 6, wherein the insulating layers located on the first side of the center wiring layer are formed of a resin material into which reinforcement is mixed, and
    the insulating layers located on the second side of the center wiring layer are formed of a resin material into which no reinforcement is mixed.

8. A multilayer wiring substrate according to claim 1, wherein the vias located on the first side of the center wiring layer and the vias located on the second side of the center wiring layer are formed so that directions of the vias are in a symmetrical fashion with respect to the center wiring layer.

9. A multilayer wiring substrate according to claim 1, further comprising:
    a dummy pattern formed on the same plane with the center wiring layer.

10. A multilayer wiring substrate according to claim 1, further comprising:

the semiconductor element mounted on the semiconductor element mounting surface.

* * * * *